(12) United States Patent
Shoulders et al.

(10) Patent No.: US 7,061,254 B1
(45) Date of Patent: Jun. 13, 2006

(54) POWER CALIBRATION FOR MULTI-PORT VECTOR NETWORK ANALYZER (VNA)

(75) Inventors: Robert Edward Shoulders, Santa Rosa, CA (US); David VerNon Blackham, Santa Rosa, CA (US); Kenneth H. Wong, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/127,852

(22) Filed: May 12, 2005

(51) Int. Cl.
*G01R 35/00* (2006.01)
(52) U.S. Cl. ........................... 324/601; 324/638
(58) Field of Classification Search ............... 324/650, 324/646, 638
See application file for complete search history.

(56) References Cited

U.S. PATENT DOCUMENTS 6,614,237 B1 * 9/2003 Ademian et al. ........... 324/601
6,861,846 B1 * 3/2005 Anderson .................... 324/623
2004/0193382 A1 * 9/2004 Adamian et al. ............ 702/118
2004/0251922 A1 * 12/2004 Martens et al. ............. 324/760

OTHER PUBLICATIONS

Roger B. Marks, "Formulations Of The Basic Vector Network Analyzer Error Model Including Switch Terms"; 50th ARFTG Conference Digest, Dec. 1997; pp. 115-126.
"Fundamentals Of RF And Microwave Power Measurements", HP Application Note 64-1A, 5965-6630E; 1998 Hewlett Packard Company: pp. 37-43.

* cited by examiner

Primary Examiner—Anjan Deb
Assistant Examiner—John Zhu
(74) Attorney, Agent, or Firm—John L. Imperato

(57) ABSTRACT

A power calibration method for a multi-port vector network analyzer (VNA) performs a two-port S-parameter calibration between a pair of ports of the multi-port VNA, and performs a power calibration of one of the ports in the pair of ports. From the two-port S-parameter calibration and the power calibration at the one port, power can be determined at one or more ports of a device under test (DUT) coupled to the ports of the multi-port VNA.

20 Claims, 5 Drawing Sheets

POWER CALIBRATION FOR MULTI-PORT VECTOR NETWORK ANALYZER (VNA)

BACKGROUND OF THE INVENTION

In some measurement applications, multi-port vector network analyzers (VNAs) rely on power calibrations at multiple ports of the multi-port VNA. Calibrating power at multiple ports using prior art calibration techniques involves coupling a power sensor to each of the ports and making a corresponding power measurement at each of the ports. This type of power calibration involves connecting and disconnecting the power sensor multiple times, which can be time consuming, can reduce measurement repeatability, and can increase the risk of operator-induced errors. In addition, when the multiple ports have different sexes or different connector types, or if the multiple ports require substantially different power levels, more than one type of power sensor may be needed to accommodate for these differences. Reducing the number of the power measurements in the power calibration of a multi-port VNA can eliminate the need for different types of power sensors, and can increase measurement repeatability, decrease measurement errors, decrease the risk of operator induced errors, and decrease the time it takes to perform the power calibration. Accordingly, there is motivation to reduce the number of power measurements that are needed for power calibration of a multi-port VNA.

DETAILED DESCRIPTION

Figure 1:
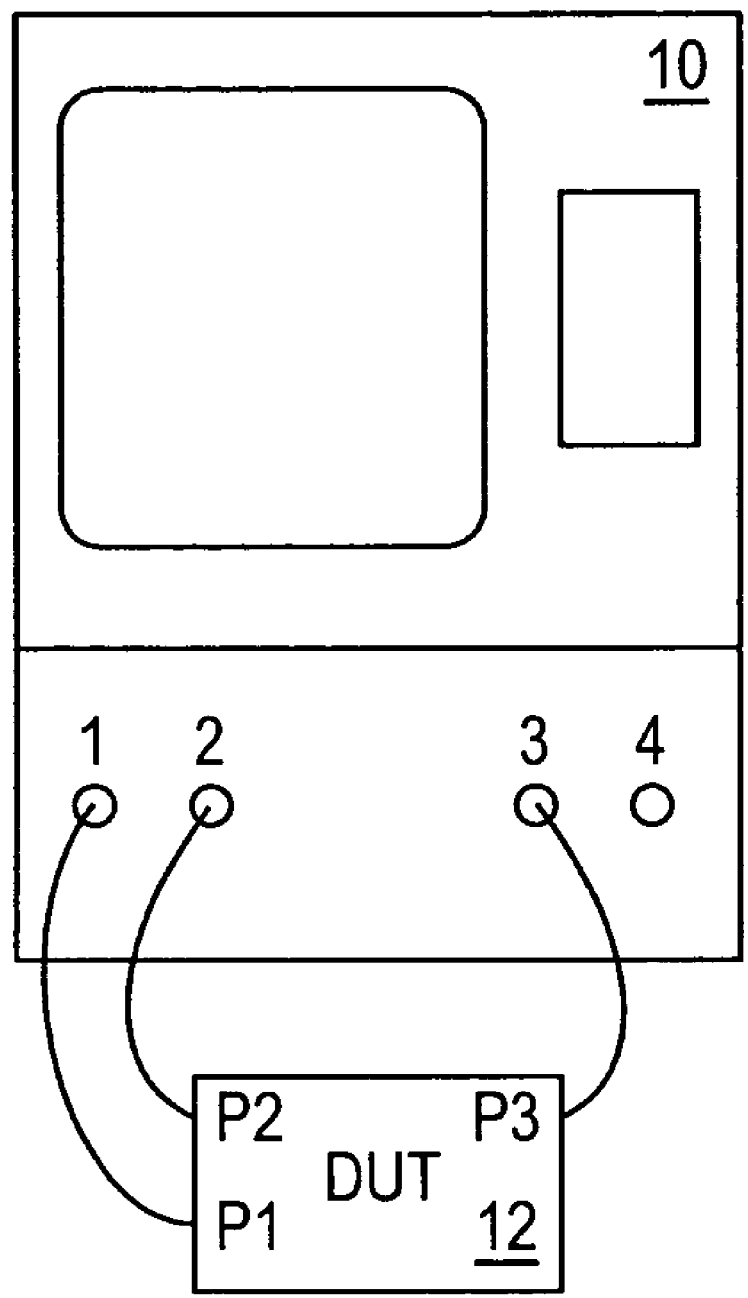
FIG. 1 shows a multi-port VNA suitable for power calibration according to embodiments of the present invention.

FIG. 1 shows a multi-port vector network analyzer (VNA) 10 suitable for power calibration according to embodiments of the present invention. The multi-port VNA 10 has two or more ports. In a typical multi-port VNA 10, each port has a stimulus capability to provide signals at the port, and a response capability to detect coupled versions of signals that are provided and received at the port. The multi-port VNA 10 of FIG. 1 is shown having four ports 1–4. A device under test (DUT) 12 is shown having three ports P1, P2, P3, that are coupled between three of the four ports 1–4 of the multi-port VNA 10. The DUT 12 can be any passive or active device, element or system, having one or more ports, that is suitable for characterization by the multi-port VNA 10.

Figure 2:
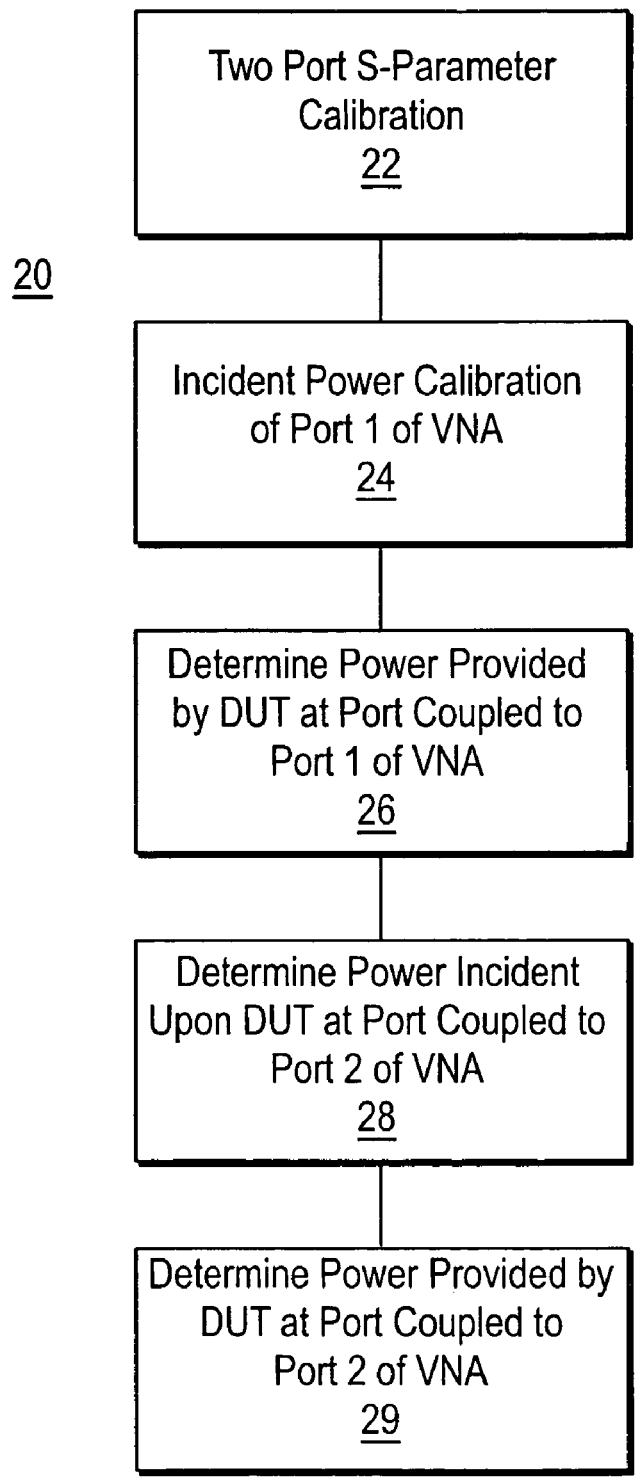
FIG. 2 shows a flow diagram of a power calibration method according to embodiments of the present invention.

FIG. 2 shows a flow diagram of a power calibration method 20 according to embodiments of the present invention. The power calibration method 20 enables power to be determined at any of the ports of the VNA 10 or the DUT 12 with a limited number of connections of a power meter to the ports of the multi-port VNA 10. In one example, power delivered by the DUT 12 to a load at one port of the DUT 12, such as a port P1 (coupled to port 1 of the multi-port VNA 10) when the DUT 12 is driven at another port, such as a port P2 (coupled to port 2 of the multi-port VNA 10) can be determined based on a power calibration of port 1 that includes a power measurement only at port 1 of the multi-port VNA 10, and a two-port S-parameter calibration between port 1 and port 2 of the multi-port VNA 10. In another example, power incident at port P2 of the DUT 12, with the multi-port VNA 10 driving the port P2 of the DUT 12, can be determined based on the power calibration of port 1 and the two-port S-parameter calibration between port 1 and port 2.

Step 22 of the power calibration method 20 shown in FIG. 2 includes performing a two-port S-parameter calibration between one or more pairs of the ports 1–4 of the multi-port VNA 10. While the two-port S-parameter calibration can be provided between any pairs of ports of the multi-port VNA 10, for the purpose of illustration, an example is provided wherein the two-port S-parameter calibration is performed between ports of the multi-port VNA 10 that are designated as port 1 and port 2.

The two-port S-parameter calibration of step 22 establishes twelve error correction terms that are associated with port 1 and port 2 of the multi-port VNA 10 and a DUT 12 coupled between port 1 and port 2 of the multi-port VNA 10. The error correction terms are typically frequency-dependent terms having magnitude and phase components, and can be obtained using any suitable two-port S-parameter calibration technique. One example of a two-port S-parameter calibration technique is provided in *Network Analyzer Basics* 1997 *Back to Basics Seminar*, by Ballo, David, Hewlett-Packard Company, HP Literature No. 5965-7008E, pages 1–68, January 1997, although many other suitable two-port S-parameter calibration techniques are know in the vector network analyzer art. The two-port S-parameter calibration can also be a subset of a multi-port S-parameter calibration for three or more ports of the multi-port VNA 10.

Figure 3A:
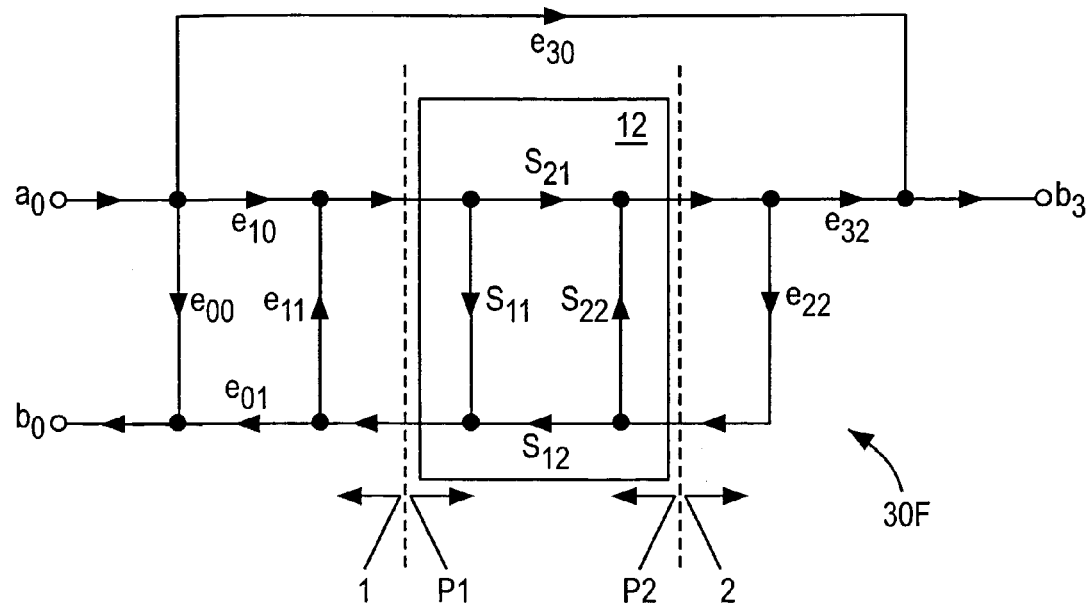
FIGS. 3A–3B show signal flow graphs associated with S-parameter calibration for two of the ports of the multi-port VNA.

The error correction terms and signals associated with two-port S-parameter calibration are illustrated with signal flow graphs, a graphical technique that is also know in the vector network analyzer art. FIG. 3A shows a signal flow graph 30F of a forward error correction model, for the multi-port VNA 10 and the DUT 12, that includes six forward error correction terms and associated signals $a_0$, $b_0$, $b_3$ that are typically frequency-dependent and have magnitude and phase components. The six forward error correction terms are listed in Table 1.

TABLE 1

| | |
|---|---|
| $e_{00} =$ | forward directivity |
| $e_{11} =$ | forward port 1 match |
| $(e_{10}e_{01}) =$ | forward reflection tracking |
| $(e_{10}e_{32}) =$ | forward transmission tracking |
| $e_{22} =$ | forward port 2 match |
| $e_{30} =$ | forward leakage |

Figure 3B:
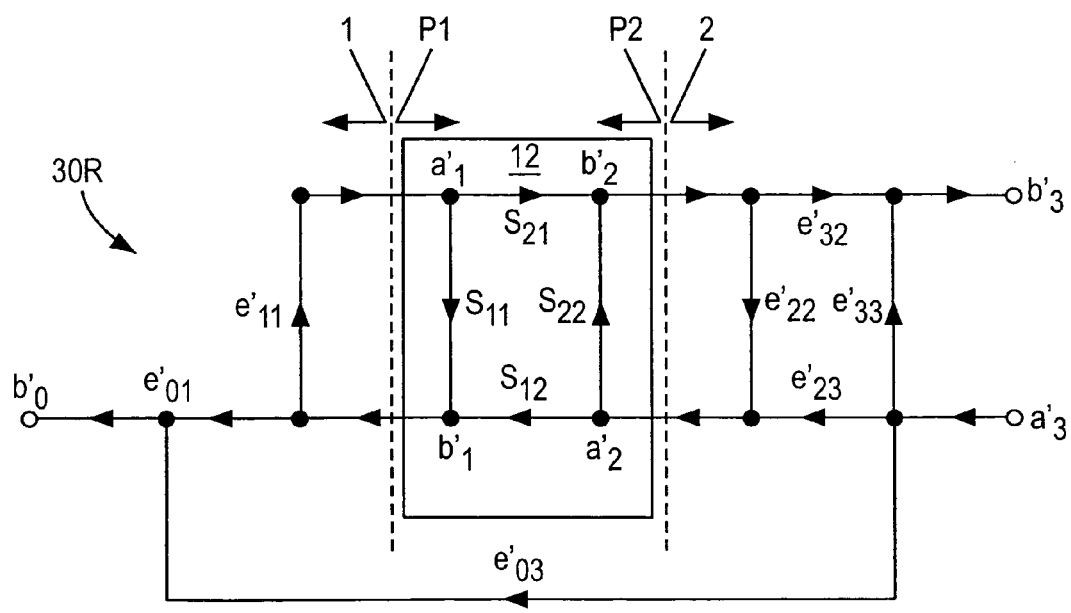

FIG. 3B shows a signal flow graph 30R of a reverse error correction model, for the VNA and DUT, that includes six reverse error correction terms and associated signals $b'_0$, $a'_1$, $b'_1$, $b'_2$, $a'_2$, $b'_3$, $a'_3$ that are typically frequency-dependent and have magnitude and phase components. The six reverse error correction terms are listed in Table 2.

TABLE 2

| | |
|---|---|
| $e'_{33}$ = | reverse directivity |
| $e'_{11}$ = | reverse port 1 match |
| $(e'_{23}e'_{32})$ = | reverse reflection tracking |
| $(e'_{23}e'_{01})$ = | reverse transmission tracking |
| $e'_{22}$ = | reverse port 2 match |
| $e'_{03}$ = | reverse leakage |

Step 24 of the power calibration method 20 (shown in FIG. 2) includes performing a power calibration of either one of the ports in the pair of ports of the multi-port VNA 10 that are included in the two-port S-parameter calibration that is performed in step 22. For example, when S-parameter calibration is performed between port 2 and port 3 of the multi-port VNA 10 in step 22, power calibration can be performed at port 2 or at port 3 of the multi-port VNA 10. For the purpose of illustration, power calibration is performed for port 1 of the multi-port VNA 10 in the example where the two-port S-parameter calibration is performed between port 1 and port 2.

Figure 4A:
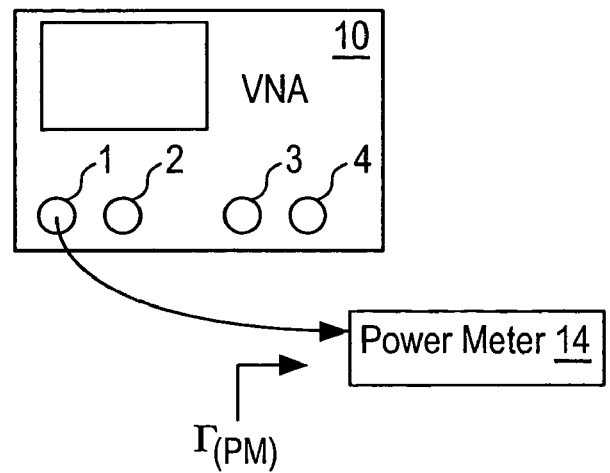
FIG. 4A shows one example of a configuration suitable for power calibration of a port of the multi-port VNA.
Figure 4B:
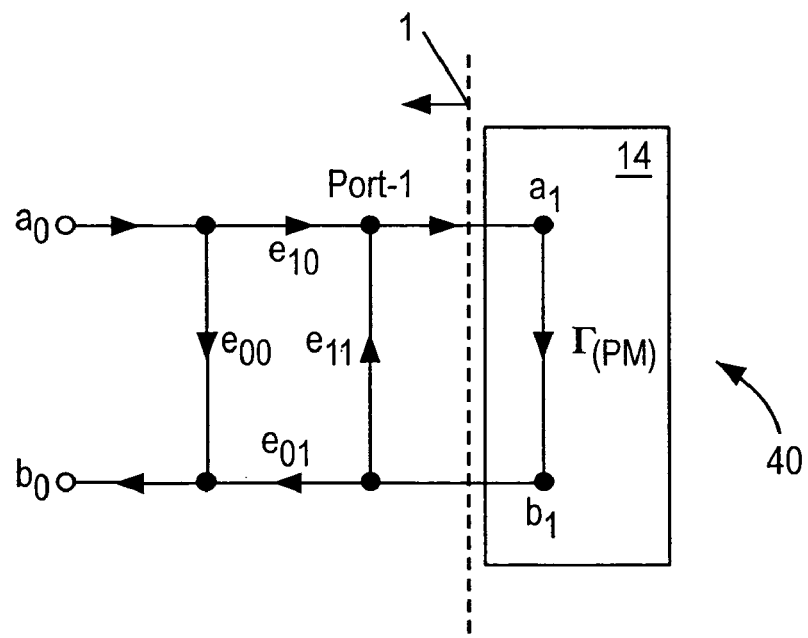
FIG. 4B shows a signal flow graph associated with the configuration of FIG. 4A.

FIG. 4A shows one example of a configuration suitable for power calibration of port 1 in step 24, wherein a power meter 14 is coupled to port 1 of the multi-port VNA 10 to measure signals provided by port 1 of the multi-port VNA 10. While the power calibration can be performed using any suitable technique, the power calibration typically includes setting the power of a calibration signal provided by port 1 of the multi-port VNA 10 to a power that is within a designated range, such as the measurement range of the power meter 14. The power calibration then includes detecting a coupled version of the calibration signal $a_0$ within the port 1 of the multi-port VNA 10, and measuring a power $P_{inc}$ of the calibration signal provided by port 1 with the power meter 14 coupled to port 1 of the multi-port VNA 10. A signal flow graph 40 (shown in FIG. 4B) shows error correction terms and signals associated with the power calibration of the port 1 of the multi-port VNA 10 that is performed in step 24. Mason's gain rule, which is known in the vector network analyzer art and described for example in *Feedback Theory-Further Properties of Signal Flow Graphs*, S. J. Mason Proc. IRE, Vol. 44, No. 7, pp. 920–926, July 1956, can be applied to the signal flow graph 40 to provide a relationship for the power measured by the power meter 14 that is indicated in equation (1).

$$P_{inc}=(|a_0|^2*|e_{10}|^2)/|1-\Gamma_{(PM)}*e_{11}|^2 \quad (1)$$

The term $\Gamma_{(PM)}$, present in equation (1) and the signal flow graph 40, represents the input match of the power meter 14. The error correction term $e_{10}$ represents the source tracking error for port 1, and the error term $e_{11}$ represents the forward match for port 1 of the multi-port VNA 10. The input match of the power meter $\Gamma_{(PM)}$ is typically measured using the multi-port VNA 10, or provided as a result of a calibration of the power meter 14. The forward port 1 match $e_{11}$ (shown in Table 1) is established as a result of the two-port S-parameter calibration performed in step 22. Solving equation (1) for the magnitude of the source tracking error $|e_{10}|$ for port 1 yields equation (2).

$$|e_{10}|=(P_{inc})^{1/2}*|1-\Gamma_{(PM)}*e_{11}|/|a_0| \quad (2)$$

From the two-port S-parameter calibration performed in step 22 and the power calibration performed in step 24, power at various ports of the VNA 10 and the DUT 12 can be determined. For example, in step 26 of the power calibration method 20, the power delivered by the DUT 12 to one port, such as the port P1 is determined. In one example, the power determined in step 26 results from the DUT 12 being driven at another port, such as the port P2, with the DUT 12 coupled to port 2 of the multi-port VNA 10. In another example, the DUT 12 delivers power at the port P1 that is independent of the other ports P2–P4 of the multi-port VNA 10.

In the example wherein the two-port S-parameter calibration (step 22) is performed between port 1 and port 2, wherein the power calibration (step 24) is performed at port 1, and wherein a port P1 and a port P2 of the DUT 12 are coupled between port 1 and port 2 of the multi-port VNA 10, respectively, step 26 includes detecting a coupled version of a signal $b_0$ within the port 1 of the multi-port VNA 10, with the port 2 of the multi-port VNA 10 driving the port P2 of the DUT 12 and the port 1 of the multi-port VNA 10 receiving the signal from the port P1 of the DUT 12.

Figure 5:
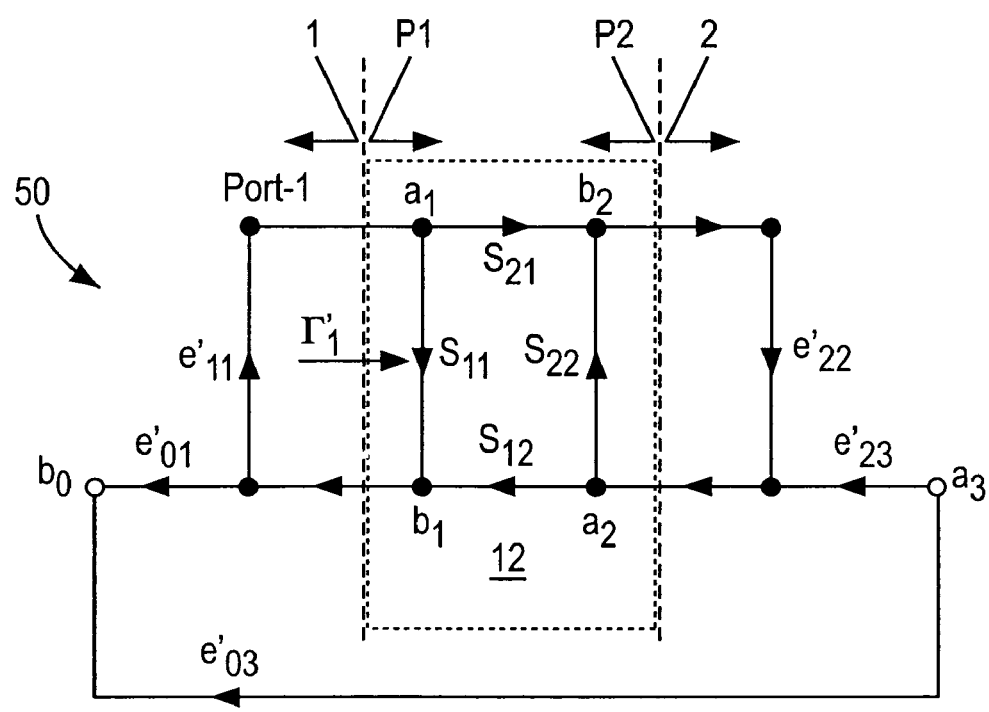
FIG. 5 shows a signal flow graph associated with power determinations included in the power calibration method according to embodiments of the present invention.

FIG. 5 shows a signal flow graph 50 associated with the powers determined according to steps 26–29 of the power calibration method 20. Mason's gain rule can be applied to the signal flow graph 50 to provide a relationship (equation 3) for a coupled version of the signal $b_0$ detected within port 1 of the multi-port VNA 10. The signal $b_0$ is expressed in terms of the S-parameters $S_{11}$, $S_{12}$, $S_{21}$, $S_{22}$ of the DUT 12, a coupled version $a_3$ of the signal that is provided by the port 2 of the multi-port VNA 10, and error correction terms established as a result of the two-port S-parameter calibration performed in step 22. The coupled version of the signal $a_3$ provided by port 2 can be detected within port 2 of the multi-port VNA 10.

$$b_0=(e'_{01}e'_{23}S_{12}/\Delta+e'_{03})a_3 \quad (3)$$

In equation (3), the term $\Delta=(1-e'_{11}\Gamma'_1)(1-S_{22}e'_{22})$ and the term $\Gamma'_1=S_{11}+S_{21}e'_{22}S_{12}/(1-S_{22}e'_{22})$. The term $\Gamma'_1$, which represents the reflection coefficient of the DUT 12 at port P1, can also be measured with port P1 of the DUT 12 coupled to port 1 of the multi-port VNA 10, without reliance on a measurement of the S-parameters of the DUT 12.

The power $P_{Z0}$ that the DUT 12 provides to a matched load $Z_0$ at the port P1 of the DUT 12 is established according to Equation (4). While the typically imperfect load of the port 1 of the multi-port VNA 10 is coupled to the port P1 of the DUT 12 to determine the power in step 26, the power $P_{Z0}$ that the DUT 12 provides to a matched load $Z_0$ at the port P1 represents the power that the DUT 12 would provide to a matched load $Z_0$ were the matched load $Z_0$ coupled to the port P1 of the DUT 12.

$$P_{Z0}=|(1-e'_{11}\Gamma'_1)|^2|(b_0/a_3)-e'_{03}|^2|a_3|^2/|e'_{01}|^2 \quad (4)$$

The error correction terms $e'_{11}$ and $e'_{03}$ in equation (4) are established as a result of the two-port S-parameter calibration performed in step 22. The signals $a_3$, $b_0$, and $b_0/a_3$ can be detected within the corresponding ports of the multi-port VNA 10 as coupled versions of signals that are provided and received at the ports 1, 2 of the multi-port VNA 10. The previously defined reflection term $\Gamma'_1$ is typically determined from the reverse port 2 match and the S-parameters of the DUT 12 measured by the multi-port VNA 10 and corrected using the error correction terms provided by one or more two-port S-parameter calibrations, as performed for example in step 22. The term $|e'_{01}|$ in equation (4), which represents the magnitude of the receiver tracking error for port 1, can be determined from an equation (5), provided in *Formulations of the Basic Vector Network Analyzer Error Model*

*Including Switch Terms*, by Roger B. Marks, 50th ARFTG Conference Digest, December 1997, pages 115–126.

$$(e_{10}e_{32})(e'_{23}e'_{01}) = [(e'_{23}e'_{32}) + e'_{33}(e_{22} - e'_{22})][(e_{10}e_{01}) + e_{00}(e'_{11} - e_{11})] \quad (5)$$

Regrouping the terms in equation (5) provides an equation (6) for the receiver tracking error $e'_{01}$ for port 1.

$$(e'_{01}) = \{[(e_{10}e_{01}) + e_{00}(e'_{11} - e_{11})]/e_{10}\} * \{[(e'_{23}e'_{32}) + e'_{33}(e_{22} - e'_{22})]/(e_{32})(e'_{23})\} \quad (6)$$

The terms $e_{10}$, $e_{01}$, $e_{00}$, $e'_{11}$, $e_{11}$, and $e_{10}$ in equation (6) are error correction terms associated with port 1 of the multi-port VNA 10, while the terms $e'_{23}$, $e'_{32}$, $e'_{33}$, $e_{22}$, $e'_{22}$, $e_{32}$, and $e'_{23}$ are error correction terms associated with port 2 of the multi-port VNA 10. The receiver tracking error $e'_{01}$ for port 1 depends only upon port 1 of the multi-port VNA 10. Accordingly, the term $\{[(e'_{23}e'_{32}) + e'_{33}(e_{22} - e'_{22})]/(e_{32})(e'_{23})\}$ in equation (6) can be set equal to one. With this designation in equation (6), the magnitude of the receiver tracking error $|e'_{01}|$ for port 1 can be established according to equation (7).

$$|e'01| = |[(e_{10}e_{01}) + e_{00}(e'_{11} - e_{11})]|/|e_{10}| \quad (7)$$

The forward reflection tracking $e_{10}e_{01}$, the forward directivity $e_{00}$, the reverse load match $e'_{11}$, and forward source match ell are established as a result of the two-port S-parameter calibration performed in step 22. The magnitude of the source tracking error for port 1 $|e_{10}|$ is established by equation (2). Accordingly, the terms in equation (7) are available to provide the magnitude of the receiver tracking error for port 1, $|e'_{01}|$. Once the magnitude of the receiver tracking error for port 1, $|e'_{01}|$, is determined, the terms in equation (4) are available to determine the power $P_{Z0}$ delivered by the DUT 12 to the load $Z_0$ at port P1.

In measurement applications wherein the reverse leakage error $e'_{03}$ in equation (4) is negligible, the power $P_{Z0}$ that the DUT 12 delivers to the load $Z_0$ can be determined in step 26 without detecting the coupled version $a_3$ of the signal provided by the port 2 of the multi-port VNA 10. The reverse leakage error $e'_{03}$ in equation (4) is negligible, for example, when the DUT 12 is a mixer having ports coupled between port 1 and port 2 of the multi-port-VNA 10 and the signal at port 1 of the multi-port VNA 10 is at a different frequency than the signal at port 2 of the multi-port VNA 10. When the DUT 12 is a signal source that is frequency locked, or otherwise referenced to the port 1 of the multi-port VNA 10, the reverse leakage error $e'_{03}$ can also be negligible.

The magnitude of the receiver tracking error for port 1, $|e'_{01}|$, determined in step 26, can be used to determine other powers at the ports of the DUT 12. In step 28, which is optionally included in the power calibration method 20, the power $|a_2|^2$ incident at port P2 of the DUT 12 can be determined with the port P2 coupled to, and driven by, the port 2 of the multi-port VNA 10. A relationship for the power $|a_2|^2$ is provided in equation (8).

$$|a_2|^2 = (|a_3|^2 * |e'_{23}|^2)/|1 - \Gamma_2 * e'_{22}|^2 \quad (8)$$

In equation (8), the magnitude of the source tracking error for port 2, $|e'_{23}| = |e'_{23}e'_{01}|/|e'_{01}|$. The term $a_3$ shown in the signal flow graph 50 can be detected within port 2 of the multi-port VNA 10 as a coupled version of the signal provided by port 2 of the multi-port VNA 10. This detected signal provides the term $|a_3|^2$ in equation (8). The magnitude of the source tracking error for port 2, $|e'_{23}|$, can be determined from the reverse transmission tracking $e'_{23}e'_{01}$ provided as a result of the two-port S-parameter calibration performed in step 22, and the magnitude of the receiver tracking error for port 1, $|e'_{01}|$, determined in step 26. The term $\Gamma_2$ in equation (8) represents the reflection coefficient of port P2 of the DUT 12, with the port P2 of the DUT 12 coupled to port 2 of the multi-port VNA 10. The reflection coefficient $\Gamma_2$ for port P2 can be corrected via a one-port S-parameter calibration of the port 2 of the multi-port VNA 10, where the one-port S-parameter calibration is typically derived from the two-port S-parameter calibration performed in step 22. All of the terms in equation (8) are available from the steps 22–26 of the power calibration method 20 to establish the incident power $|a_2|^2$ at port P2 of the DUT 12. The port P2 can be the only port of the DUT 12, for example when the DUT 12 is a one port device, or the port P2 can be one port of a DUT 12 that has multiple ports.

Power $P_{Z02}$ provided by the DUT 12 to a matched load $Z_0$ coupled to port P2 of the DUT 12 can also be determined according to a step 29, optionally included in the power calibration method 20. The power $P_{Z02}$ is indicated by equation (9).

$$P_{Z02} = |(1 - e_{22}\Gamma'_2)|^2 |(b_3/a_0) - e_{30}|^2 |a_0|^2 / |e_{32}|^2 \quad (9)$$

In equation (9), $\Gamma'_2 = S_{22} + S_{12}e_{11}S_{21}/(1 - S_{11}e_{11})$ and $|e_{32}| = |e_{32}e_{10}|/|e_{10}|$. The forward transmission tracking error $e_{32}*e_{10}$ included in the term $|e_{32}|$ is established as a result of the two-port S-parameter calibration performed in step 22, and the magnitude of the source tracking error for port 1, $|e_{10}|$, is established as a result of the power calibration performed in step 24. In one example, the power $P_{Z02}$ determined in step 29 results from the DUT 12 being driven at another port, such as the port P1, with the port P1 of the DUT 12 coupled to port 1 of the multi-port VNA 10. In another example, the DUT 12 provides a signal at the port P2 that is independent of the other ports of the multi-port VNA 10.

In the example wherein the two-port S-parameter calibration (step 22) is performed between port 1 and port 2, wherein the power calibration (step 24) is performed at port 1, and wherein a port P1 and the port P2 of the DUT 12 are coupled between port 1 and port 2 of the multi-port VNA 10, respectively, step 29 includes detecting, within the port 1 of the multi-port VNA 10, a coupled version $a_0$ of a signal provided by the port 1 of the multi-port VNA 10 to drive the port P1 of the DUT 12. In this example, step 29 also includes detecting, within port 2 of the multi-port VNA 10 a coupled version $b_3$, of a signal received by the port P2 of the DUT 12.

In measurement applications wherein the forward leakage error $e_{30}$ in equation (9) is negligible, the power $P_{Z02}$ that the DUT 12 delivers to the load $Z_0$ can be determined in step 29 without detecting the coupled version $a_0$ of the signal provided by the port 1 of the multi-port VNA 10. The forward leakage error $e_{30}$ in equation (9) is negligible, for example, when the DUT 12 is a mixer having ports coupled between port 1 and port 2 of the multi-port VNA 10 and the signal at port 2 of the multi-port VNA 10 is at a different frequency than the signal at port 1 of the multi-port VNA 10. When the DUT 12 is a signal source that is frequency locked, or otherwise referenced to the port 2 of the multi-port VNA 10, the forward leakage error $e_{30}$ can also be negligible.

According to an alternative embodiment of the power calibration method 20, the power calibration performed in step 24 includes applying a calibration signal having a measured, known, or otherwise established power $P_{CAL}$, to port 1 of the multi-port VNA 10. In one example, the calibration signal is provided by a signal source having a matched output impedance, wherein the signal source is frequency-locked, or otherwise referenced to port 1 of the multi-port VNA 10. In another example, the calibration signal is provided to port 1 of the multi-port VNA 10 by the port 2 of the multi-port VNA 10, where a matched output impedance is achieved by an attenuator at the port 2, and where the power of the calibration signal is measured with a power meter 14.

According to this embodiment, the power calibration in step 24 then includes measuring a coupled version $b_0$, within port 1 of the multi-port VNA 10, of the calibration signal provided to the port 1. The magnitude of the receiver tracking error for port 1, $|e'_{01}|$, can then be established according to equation (10).

$$|e'_{01}| = |b_0/(P_{inc})^{1/2}| \quad (10)$$

According to this embodiment of the power calibration method 20, the power $P_{Z0}$ that the DUT 12 provides to a matched load $Z_0$ at the port P1, determined in step 26, can be established based on equation (4), and the power $|a_2|^2$ incident at port P2 of the DUT 12 can be determined based on equation (8). The power $P_{Z02}$ provided by the DUT 12 to a matched load $Z_0$ coupled to port P2 of the DUT 12 can be determined according to equation (9), wherein equation (7) can be used to establish the magnitude of the source tracking error for port 1, $|e_{10}|$, present in the term $|e_{32}|$ in equation (9). The power $P_{P1}$ incident on port P1 of the DUT 12 can be established according to equation (11).

$$P_{P1} = (|a_0|^2 * |e_{10}^2|)/|1 - \Gamma_{P1} * e_{11}|^2 \quad (11)$$

In equation (11), the term $\Gamma_{P1}$ represents the input reflection coefficient of the port P1 of the DUT 12. The magnitude of the source tracking error for port 1, $|e_{10}|$, also present in equation (11) can be established using equation (7).

In the embodiments of the power calibration method 20, an example is provided wherein the two-port S-parameter calibration performed in step 22 is designated to be between port 1 and port 2 of the multi-port VNA 10, and the power calibration performed in step 24 is designated to be at port 1 of the multi-port VNA 10. These designations are examples, for the purpose of illustration. According to the embodiments of the present invention, port 1 and port 2 represent any pair of ports of the multi-port VNA 10, and the power calibration at port 1 represents a power calibration at either of the ports in the pair of ports of the multi-port VNA 10 between which the S-parameter calibration has been performed. Port P1 and port P2 represent any pair of ports of the DUT 12 that are coupled to corresponding ports of the multi-port VNA 10, wherein the DUT 12 has one or more ports.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A power calibration method for a multi-port vector network analyzer (VNA), comprising:
    performing a two-port S-parameter calibration between a first port of the VNA and a second port of the VNA;
    performing a power calibration at only the first port of the VNA; and
    determining a power provided by a first port of a device under test (DUT) that is coupled to the first port of the VNA, based on the two-port S-parameter calibration performed between a first port of the VNA and a second port of the VNA, the power calibration performed at only the first port of the VNA, a reflection coefficient of the first port of the DUT, and a detection of a coupled version of a signal received by the first port of the VNA.

2. The method of claim 1 wherein determining the power provided by the first port of the DUT includes a detection of a coupled version of a signal provided by the second port of the VNA.

3. The method of claim 1 wherein the power provided by the first port of the DUT is to a matched load.

4. The method of claim 2 wherein the power provided by the first port of the DUT is to a matched load.

5. The method of claim 1 wherein performing the power calibration at the first port of the VNA includes setting the power of a calibration signal provided by the first port of the VNA within a designated power range, detecting a coupled version of the calibration signal within the first port of the VNA, and measuring the power of the calibration signal at only the first port of the VNA.

6. The method of claim 2 wherein performing the power calibration at the first port of the VNA includes setting the power of a calibration signal provided by the first port of the VNA within a designated power range, detecting a coupled version of the calibration signal within the first port of the VNA, and measuring the power of the calibration signal at only the first port of the VNA.

7. The method of claim 1 wherein performing the power calibration at the first port of the VNA includes providing a calibration signal having an established power level to the first port of the VNA, and detecting a coupled version of the calibration signal within the first port of the VNA.

8. The method of claim 2 wherein performing the power calibration at the first port of the VNA includes providing a calibration signal having an established power level to the first port of the VNA, and detecting a coupled version of the calibration signal within the first port of the VNA.

9. The method of claim 1 wherein the DUT has a second port coupled to the second port of the VNA and driven by a signal provided by the second port of the VNA.

10. The method of claim 3 wherein the DUT has a second port coupled to the second port of the VNA and driven by a signal provided by the second port of the VNA.

11. The method of claim 1 further comprising determining power incident at a second port of the DUT with the second port of the VNA providing a signal to drive the second port of the DUT, based on detecting a coupled version of the signal provided by the second port of the VNA, a reflection coefficient of the second port of the DUT, and a reverse match of the second port of the VNA established by the two-port S-parameter calibration.

12. A power calibration method for a multi-port vector network analyzer (VNA), comprising:
    performing a two-port S-parameter calibration between a first port of the VNA and the second port of the VNA to establish a series of error correction terms;
    performing a power calibration at only the first port of the VNA;
    coupling a device under test (DUT) to the first port of the VNA; and
    determining power provided by a DUT at a port of the DUT coupled to the first port of the VNA based on the series of error correction terms, a magnitude of a receiver tracking error for the first port of the VNA established from the magnitude of a source tracking error for the first port of the VNA, a reflection coefficient of the port of the DUT coupled to the first port of the VNA, and a detection of a coupled version of a signal received by the first port of the VNA.

13. The method of claim 12 further comprising coupling a port of the DUT, not coupled to the first port of the VNA, to the second port of the VNA, wherein the second port of the VNA provides a signal to drive the port of the DUT that is coupled to the second port of the VNA.

14. The method of claim 13 further including detecting a coupled version of a signal provided by the second port of the VNA to drive the port of the DUT that is coupled to the second port of the VNA.

15. The method of claim 12 wherein the power provided by the DUT at the port of the DUT that is coupled to the first port of the VNA is the power to a matched load.

16. The method of claim 12 wherein performing the power calibration at only the first port of the VNA includes setting the power of a calibration signal provided by the first port of the VNA within a designated power range, detecting a coupled version of the calibration signal within the first port of the VNA, and measuring the power of the calibration signal at the first port of the VNA.

17. The method of claim 12 wherein performing the power calibration at only the first port of the VNA includes providing a calibration signal having an established power level to the first port of the VNA, and detecting a coupled version of the calibration signal within the first port of the VNA.

18. The method of claim 12 further comprising determining power incident at a port of the DUT coupled to the second port of the VNA based on detecting a coupled version of the signal provided by the second port of the VNA, a reflection coefficient of the second port of the DUT, a magnitude of a source tracking error for the second port of the VNA, and a reverse match of the second port of the VNA established according to the series of error correction terms.

19. A power calibration method for a multi-port vector network analyzer (VNA), comprising:
performing a two-port S-parameter calibration between a first port of the VNA and the second port of the VNA to establish a series of error correction terms;
performing a power calibration that includes a power measurement at only the first port of the VNA;
coupling a device under test (DUT) to the second port of the VNA; and
determining power incident at a port of the DUT coupled to the second port of the VNA that provides a signal to drive the second port of the DUT, based on detecting a coupled version of the signal provided by the second port of the VNA, a reflection coefficient of the port of the DUT that is coupled to the second port of the VNA, and a reverse match of the second port of the VNA established according to the series of error correction terms.

20. The method of claim 19 wherein performing the power calibration at only the first port of the VNA includes setting the power of a calibration signal provided by the first port of the VNA within a designated power range, detecting a coupled version of the calibration signal within the first port of the VNA, measuring the power of the calibration signal at the first port of the VNA, and determining the magnitude of a source tracking error for the first port of the VNA.

* * * * *

UNITED STATES PATENT AND TRADEMARK OFFICE
CERTIFICATE OF CORRECTION

| | | |
|---|---|---|
| PATENT NO. | : 7,061,254 B1 | Page 1 of 1 |
| APPLICATION NO. | : 11/127852 | |
| DATED | : June 13, 2006 | |
| INVENTOR(S) | : Shoulders et al. | |

It is certified that error appears in the above-identified patent and that said Letters Patent is hereby corrected as shown below:

On the Title page, in field (56), under "Other Publications", in column 2, line 5, after "1998" insert -- , --.

On the Title page, in field (56), under "Other Publications", in column 2, line 6, delete "Company:" and insert -- Company; --, therefor.

Signed and Sealed this

Twenty-first Day of November, 2006

JON W. DUDAS
*Director of the United States Patent and Trademark Office*